United States Patent
Weintraub

(10) Patent No.: US 6,593,791 B1
(45) Date of Patent: Jul. 15, 2003

(54) PRECISION DIGITAL DELAY ELEMENT HAVING STABLE OPERATION OVER VARIED MANUFACTURING PROCESSES AND ENVIRONMENTAL OPERATING CONDITIONS

(75) Inventor: Sharon Lynn Weintraub, Encinitas, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/115,359

(22) Filed: Apr. 3, 2002

(51) Int. Cl.[7] .............................................. H03H 11/26
(52) U.S. Cl. ...................... 327/262; 327/269; 327/276; 327/277; 327/298
(58) Field of Search ................................ 327/262, 263, 327/269, 270, 271, 276, 277, 284, 297, 298, 299

(56) References Cited

U.S. PATENT DOCUMENTS

| | | | | |
|---|---|---|---|---|
| 4,637,018 A | * | 1/1987 | Flora et al. ..................... | 371/1 |
| 5,185,768 A | * | 2/1993 | Ferraiolo et al. ............ | 375/119 |
| 6,025,745 A | * | 2/2000 | Lee et al. .................... | 327/277 |
| 6,104,223 A | * | 8/2000 | Chapman et al. ........... | 327/276 |
| 6,359,483 B1 | * | 3/2002 | Watkins et al. ............. | 327/158 |

\* cited by examiner

*Primary Examiner*—Timothy P. Callahan
*Assistant Examiner*—An T. Luu
(74) *Attorney, Agent, or Firm*—Gray Cary Ware & Freidenrich; Terrance A. Meador

(57) ABSTRACT

A digital delay circuit employs a stable reference clock signal, delayed by a reference delay line, to obtain information related to delay characteristics of a matching input delay line. An input clock signal is delayed by the input delay line, which provides a plurality of variously delayed input clock signals based upon the input clock signal. The reference delay line provides a plurality of variously delayed reference clock signals based upon the stable reference clock signal; the delayed reference clock signals convey information related to the operating characteristics of both delay lines. In response to such information, one of the delayed input clock signals can be selected as a delayed clock output. The reference and input delay lines are configured such that the delay circuit consistently generates a delayed clock output having an actual delay that falls within a specified range of delay.

23 Claims, 8 Drawing Sheets

PRECISION DIGITAL DELAY ELEMENT HAVING STABLE OPERATION OVER VARIED MANUFACTURING PROCESSES AND ENVIRONMENTAL OPERATING CONDITIONS

CROSS REFERENCE TO RELATED APPLICATIONS

The subject matter disclosed herein is related to the subject matter disclosed in U.S. patent application Ser. No. 10/114,835, titled "CASCADABLE FREQUENCY DOUBLER HAVING STABLE OPERATION OVER VARIED MANUFACTURING PROCESSES AND ENVIRONMENTAL OPERATING CONDITIONS."

FIELD OF THE INVENTION

The present invention relates generally to digital delay circuits. More particularly, the present invention relates to a digital delay circuit that compensates for practical variations in manufacturing processes and operating conditions.

BACKGROUND OF THE INVENTION

Many digital circuits utilize delay elements designed to delay a digital signal by either an absolute amount or by a defined fraction of its clock period. In practice, such delay elements can be utilized in a variety of applications, e.g., frequency doublers and parallel data transfer. A conventional digital delay element may include a series of buffer elements, each having an incremental delay associated therewith. For example, if a clock signal with a period of 3.2 nanoseconds needs to be delayed by 800 picoseconds, then the clock signal can be delayed with an appropriate number of buffers to arrive at a nominal delay of 800 picoseconds. In real world applications, however, variations in process, temperature, voltage, and other environmental conditions can result in an actual delay that ranges between 500 picoseconds to 1100 picoseconds. Unfortunately, some applications cannot tolerate such a high amount of imprecision in the delay.

One known solution to the above problem is to screen and discard devices having actual delay characteristics that fall outside of the specified limits. Depending upon the manufacturing process and external conditions, such screening can potentially result in a large yield loss.

In a system in which a clock delay is utilized to latch digital data, a clock recovery unit may be employed to derive the clock from the data or from a signal having the same timing as the data. While this approach avoids the need to have an independent clock signal with the specified delay, it can be costly in terms of power and physical circuit area.

Another prior art approach utilizes a high speed shift register to delay an external clock signal. This solution typically requires a relatively high amount of operating power, and it introduces the problem of metastability (the metastability issue can be addressed at the expense of additional operating power).

Accordingly, it would be desirable to have a digital delay circuit that provides a narrow range of practical delay values across a variety of process and/or environmental conditions.

BRIEF SUMMARY OF THE INVENTION

A digital delay circuit according to the present invention compensates for variations in process and environmental conditions by using a stable reference clock signal and two matched delay line elements. The delay circuit is capable of delaying an external clock signal by a nominal delay and within narrow tolerances relative to conventional digital delay circuits.

The above and other aspects of the present invention may be carried out in one form by a method for delaying a digital clock signal. The method involves applying a reference clock signal to a reference delay element, applying an input clock signal to an input delay element, where the reference delay element and the input delay element have matching operational characteristics, obtaining, from the reference delay element, information identifying delay characteristics of the reference delay element, and generating a delayed clock signal, based upon the input clock signal, in response to the information.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

The present invention may be described herein in terms of functional block components and various processing steps. It should be appreciated that such functional blocks may be realized by any number of hardware components configured to perform the specified functions. For example, the present invention may employ various integrated circuit components, e.g., memory elements, clock elements, logic elements, look-up tables, and the like, which may carry out a variety of functions under the control of one or more microprocessors or other control devices. In addition, those skilled in the art will appreciate that the present invention may be practiced in conjunction with any number of applications and that the structures and features described herein can be physically realized in a variety of forms.

It should be appreciated that the particular implementations shown and described herein are illustrative of the invention and its best mode and are not intended to otherwise limit the scope of the invention in any way. Indeed, for the sake of brevity, conventional techniques related to clock generation, data latching, multiplexing, data transmission, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical embodiment.

Figure 1:
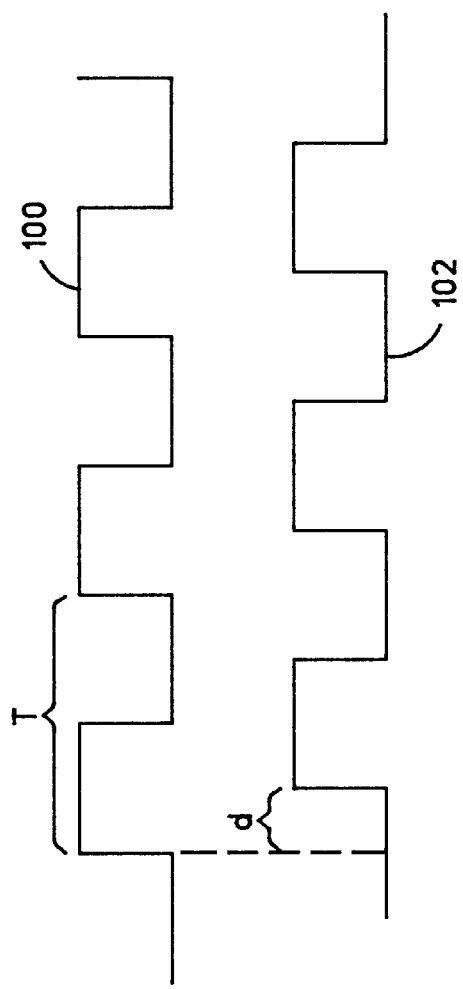
FIG. 1 is a timing diagram depicting a clock signal and a corresponding delayed clock signal.

Any number of practical applications may require a digital delay circuit or component. For example, a digital circuit may be required to delay a clock signal by a predetermined amount. In this context, FIG. 1 is a timing diagram depicting a clock signal 100 and a corresponding delayed clock signal 102. Although not a requirement of the present invention, clock signal 100 has a 50% duty cycle. Clock signal 100 is periodic with a period of T seconds. Delayed clock signal 102, which may be based upon clock signal 100, also has a 50% duty cycle and a period of T seconds. Delayed clock signal 102 is depicted with a delay of d seconds, relative to clock signal 100.

In the following example embodiment, T=3.2 nanoseconds and the desired delay (d) is 800 picoseconds. In many practical applications, the delay circuit must maintain the nominal delay plus or minus a specified tolerance. In the example embodiment, a tolerance of ±100 picoseconds is presumed, thus resulting in a tolerable delay range of 700–900 picoseconds. Of course, the specific numerical design values, empirical values, and other quantities set forth herein relate to the example embodiment. These quantities can vary from application to application, and the present invention is not limited to any specific implementation.

Figure 2:
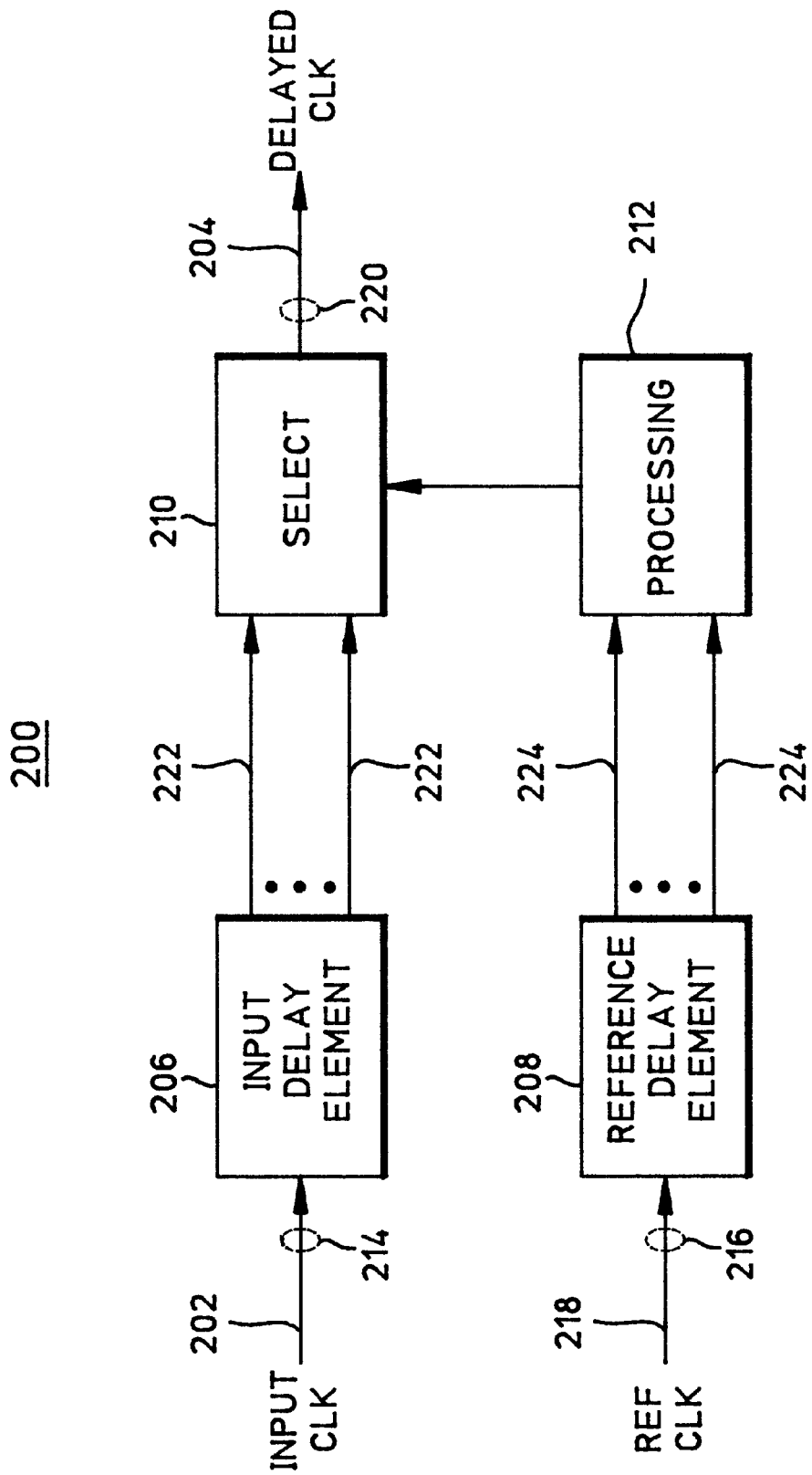
FIG. 2 is a schematic representation of a digital delay circuit configured in accordance with the present invention.

FIG. 2 is a schematic representation of a digital delay circuit 200 configured in accordance with the present invention. Circuit 200 receives an input clock signal 202 (from any suitable internal or external source), delays input clock signal 202, and produces a delayed clock signal 204 based upon input clock signal 202. Ideally, circuit 200 would consistently delay clock signal 202 by a nominal delay value, regardless of environmental operating conditions and regardless of manufacturing process variations related to the physical device that implements circuit 200. In a practical embodiment, however, circuit 200 delays clock signal 202 by approximately the nominal delay value. In other words, in practice, the actual delay of delayed clock signal 204 may fall within a specified range of delay values.

Circuit 200 generally includes an input delay element 206, a reference delay element 208, a selection circuit or component 210, and a processing circuit or component 212. Input delay element 206 is coupled (directly or indirectly) to selection circuit 210, and reference delay element 208 is coupled (directly or indirectly) to processing circuit 212. Processing circuit 212 is also coupled (directly or indirectly) to selection circuit 210; consequently, selection circuit 210 is coupled to reference delay element 208 via processing circuit 212. Input delay element 206 includes an input node or port 214 for receiving input clock signal 202, reference delay element 208 includes an input node or port 216 for receiving a reference clock signal 218, and selection circuit 210 includes an output node or port 220 for delayed clock signal 204.

Figure 3:
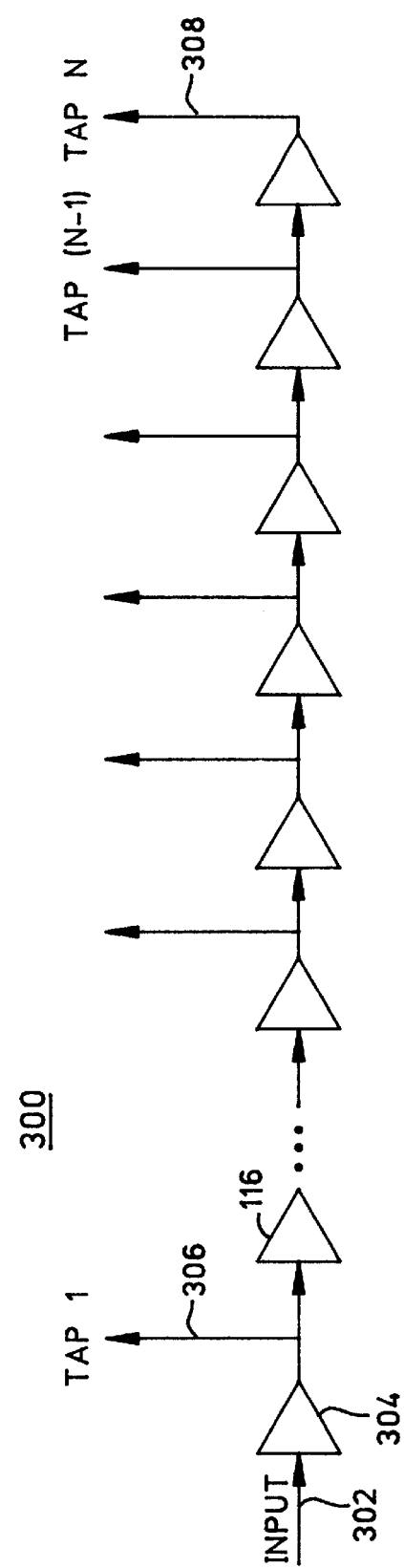
FIG. 3 is a schematic representation of a delay line element that may be utilized by the circuit shown in FIG. 2.

In a practical embodiment, input delay element 206 and reference delay element 208 are each realized as a digital delay line. In this regard, FIG. 3 is a schematic representation of a delay line 300 that may be utilized by digital delay circuit 200. Delay line 300 may be configured in accordance with conventional delay line designs. For example, delay line 300 includes a plurality of delay buffers connected in series. A digital input signal 302 is applied to a first delay buffer 304, which delays input signal 302 by an incremental amount. Each subsequent delay buffer in delay line 300 contributes to the overall delay of input signal 302 (in the preferred practical embodiment, all of the delay buffers in delay line 300 incrementally delay input signal 302 by the same nominal amount). For purposes of the numerical example described herein, each delay buffer has a nominal delay of 40 picoseconds, and the actual range of delay per buffer may vary with process and environmental variations. Delay line 300 may include any number of delay buffers; FIG. 3 depicts a generalized embodiment having N delay buffers.

Delay line 300 may include up to N delay taps corresponding to the delay buffers. In a practical embodiment, delay line 300 includes N delay taps (one for each of the N delay buffers). As shown in FIG. 3, a delay tap represents the output of a respective delay buffer. In this regard, a delay tap may be realized as an output node or port of delay line 300 and/or as an internal connection or transition point within delay line 300. As described in more detail below, a digital delay circuit according to the present invention need not utilize all of the delay taps provided by delay line 300 (i.e., the delay circuit may utilize a subset of the delay taps to provide up to N delayed output signals).

The plurality of delay taps in delay line 300 provide a number of variously delayed clock signals based upon input clock signal 302. For example, the first delay tap 306 provides a delayed clock signal that represents input clock signal 302 delayed by first delay buffer 304, while the last delay tap 308 provides another delayed clock signal that represents input clock signal 302 delayed by the combination of N delay buffers. In this manner, delay line 300 can be configured to generate up to N delayed clock signals, each being delayed by a different amount relative to input clock signal 302.

Referring again to FIG. 2, input delay element 206 generates a plurality of variously delayed clock signals based upon input clock signal 202, and reference delay element 208 generates a plurality of variously delayed clock signals based upon reference clock signal 218. A practical embodiment of digital delay circuit 200 utilizes a proper subset of the variously delayed input clock signals and a proper subset of the variously delayed reference clock signals. In this regard, input delay element 206 provides a number of variously delayed clock signals 222 (each based upon input clock signal 202) for use as inputs to selection circuit 210. Likewise, reference delay element 208 provides a number of variously delayed clock signals 224 (each based upon reference clock signal 218) for use as inputs to processing circuit 212. Accordingly, some or all of the delay taps of input delay element 206 are coupled (directly or indirectly) to selection circuit 210, and some or all of the delay taps of reference delay element 208 are coupled (directly or indirectly) to processing circuit 212.

Input delay element 206 and reference delay element 208 are suitably configured such that they have matching operational characteristics. As used herein, "matching operational characteristics" means that: (1) input delay element 206 and reference delay element 208 exhibit the same (within practical manufacturing and design tolerances) nominal delay per buffer; (2) in response to changes in environmental conditions (e.g., operating temperature and humidity), the variation in the actual delay per buffer of input delay element 206 tracks (within practical tolerances) the variation in the actual delay per buffer of reference delay element 208; and (3) in response to different device manufacturing processes, the variation in the actual delay per buffer of input delay element 206 tracks (within practical tolerances) the variation in the actual delay per buffer of reference delay element 208.

In a practical embodiment, the two delay elements are manufactured using the same device manufacturing processes. In addition, the two delay elements are typically manufactured using a single integrated circuit chip, thus ensuring consistency in the manufacturing process. Although not a requirement of the present invention, input delay element 206 and reference delay element 208 may include the same number of internal delay buffers and the same number of potentially available delay taps. As described above, however, the number of delay taps utilized for outputs and/or the specific delay taps selected to provide outputs will typically differ between input delay element 206 and reference delay element 208.

Figure 4:
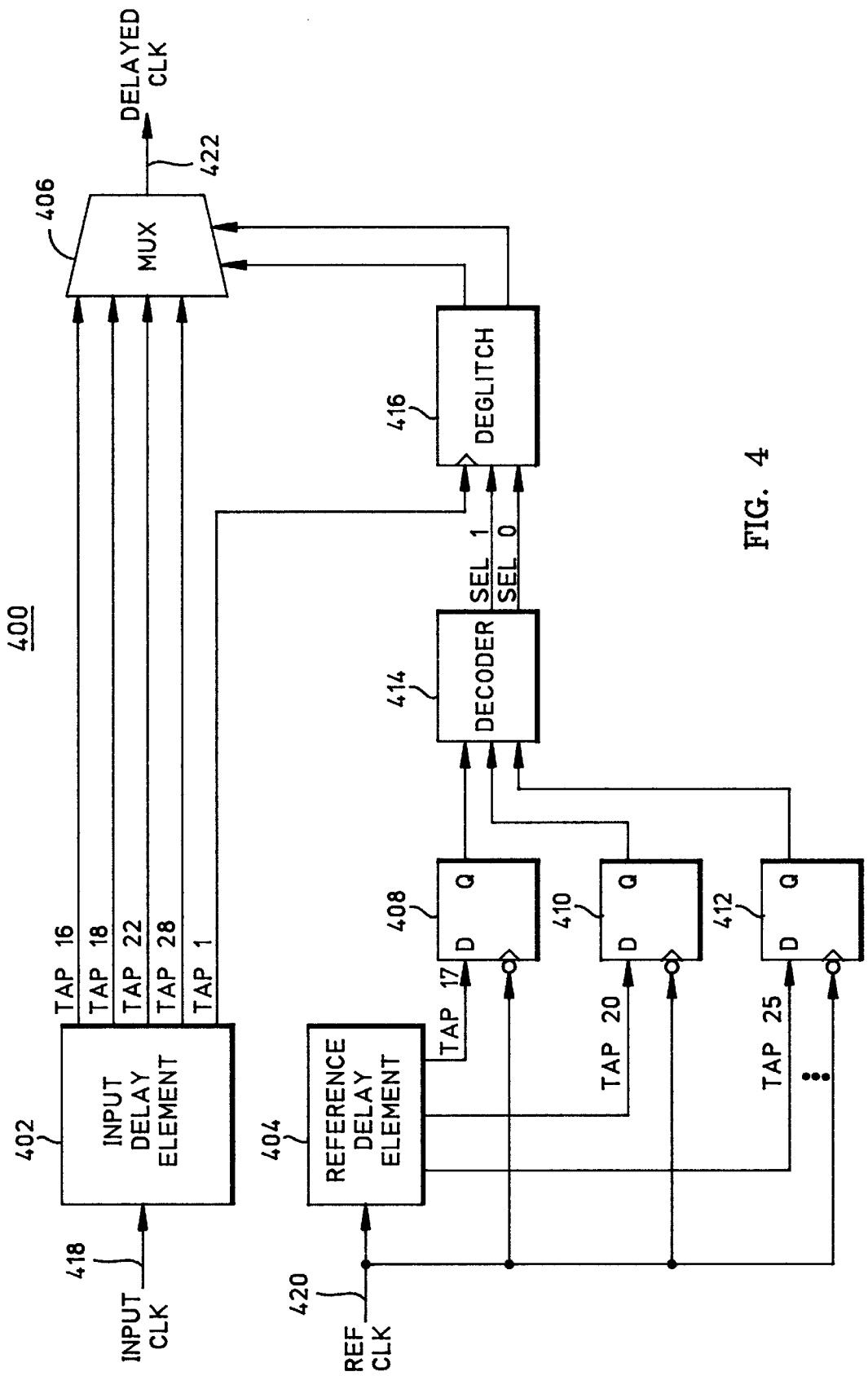
FIG. 4 is a schematic representation of a digital delay circuit configured in accordance with an example embodiment of the present invention.

FIG. 4 is a schematic representation of a digital delay circuit 400 configured in accordance with an example embodiment of the present invention. Circuit 400 represents one possible practical implementation of digital delay circuit 200, and will be described herein in the context of a specific numerical example of the present invention.

Digital delay circuit 400 generally includes an input delay element 402, a reference delay element 404, a selection component realized as a multiplexer 406, a sampling circuit realized as a plurality of flip flops 408/410/412, a digital decoder 414, and a deglitching circuit or component 416. Referring to FIG. 2, multiplexer 406 represents selection circuit 210, and the combination of flip flops 408/410/412, decoder 414, and deglitching circuit 416 represents processing circuit 212. Input delay element 402 receives an input clock signal 418, reference delay element 404 receives a reference clock signal 420, and multiplexer 406 outputs a delayed clock signal 422.

As described above in connection with delay line 300, input delay element 402 may include any number of delay buffers and any number of corresponding delay taps. Delay circuit 400, however, only utilizes a selected number of delay taps from input delay element 402, namely, tap one, tap sixteen, tap eighteen, tap twenty-two, and tap twenty-eight. The variously delayed representations of input clock signal 418 that appear on tap sixteen, tap eighteen, tap twenty-two, and tap twenty-eight serve as inputs to multiplexer 406, while the output of tap one serves as a clock signal for deglitching circuit 416. In the example embodiment, multiplexer 406 is suitably configured to select one of the variously delayed input clock signals (i.e., one of the four delay tap output signals) in response to information derived from the operation of reference delay element 404.

Reference clock signal 420 should be stable and precise over practical operating conditions and regardless of manufacturing process variations. In practical embodiments, reference clock signal 420 can be generated using an on-chip voltage controlled oscillator circuit (not shown). Reference clock signal 420 need not have any phase relationship with input clock signal 418. Although reference delay element 404 may also include any number of delay buffers and any number of corresponding delay taps, delay circuit 400 only utilizes a selected number of delay taps from reference delay element 404. In this regard, the variously delayed representations of reference clock signal 420 that appear on tap seventeen, tap twenty, and tap twenty-five serve as respective inputs to flip flops 408/410/412. As described in more detail below, these delayed clock outputs convey information identifying delay characteristics of reference delay element 404. Assuming that the operational characteristics of input delay element 402 match the operational characteristics of reference delay element 404, these outputs of reference delay element 404 also convey information regarding delay characteristics of input delay element 402. Specifically, reference clock signal 420 and the corresponding delayed reference clock signals can be utilized to determine the number of input delay line buffers needed to produce a specified propagation delay for input clock signal 418.

Flip flops 408/410/412 utilize reference clock signal 420 as a latching clock (in the example embodiment, the falling transition edge of reference clock signal 420 clocks flip flops 408/410/412). Accordingly, flip flops 408/410/412 function as a sampling circuit that samples the variously delayed reference clock signals (at the three selected delay taps) to obtain three sampled values.

The outputs of flip flops 408/410/412 are coupled (directly or indirectly) to decoder 414. Decoder 414 is suitably configured to receive the sampled values corresponding to the variously delayed output signals, and to generate one or more selection signals in response to the sampled values. The example embodiment shown in FIG. 4 utilizes a 3:2 bit decoder 414 that generates two selection signals in response to the three sampled values (in the example embodiment, the three-bit input to decoder 414 is utilized to identify only four distinct states; a number of three-bit input combinations represent "don't care" conditions). Decoder 414 may be realized using a look-up table, a state machine, or any number of known digital logic techniques.

The outputs of decoder 414 are coupled (directly or indirectly) to deglitching circuit 416. Deglitching circuit 416 may employ one or more flip flops (not shown) or other devices to ensure that the states of the selection signals to multiplexer 406 are stable during the transition of the tap outputs of input delay element 402 (taps 16, 18, 22, and 28 in this example). This ensures that delayed clock signal 422 is "glitch free." In this regard, deglitching circuit 416 is responsive to a rising edge of input clock signal 418 (in the example embodiment, deglitching circuit 416 is triggered by the rising edges of the delayed clock signal available at tap number one). Deglitching circuit 416 is coupled (directly or indirectly) to multiplexer 406 such that the deglitched selection signal outputs are provided to multiplexer 406. As described above, multiplexer 406 selects an appropriate output signal for use as delayed clock signal 422 in response to information (i.e., the selection bits) derived from the operation of reference delay element 404.

Figure 5:
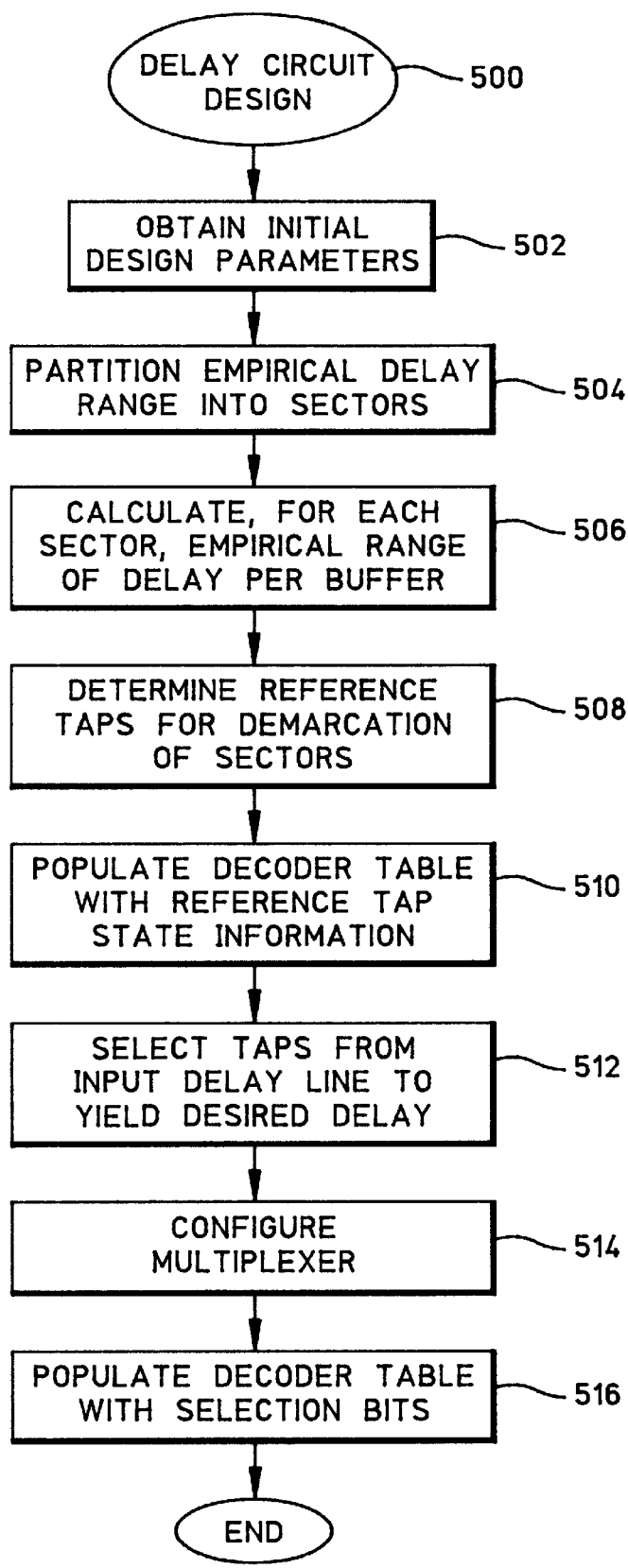
FIG. 5 is a flow diagram representing an example design process for a delay circuit according to the present invention.

In practice, a digital delay circuit according to the present invention is designed to accommodate a specified nominal clock delay and to compensate for variations in process and environmental conditions. The design of such a digital delay circuit involves the selection of delay taps from the input delay element and from the reference delay element. FIG. 5 is a flow diagram representing an example design process 500 for a delay circuit according to the present invention. Process 500 may be performed by hand and/or by a machine such as a calculator or a computer executing a suitable software application. Process 500 is consistent with the example embodiment described above in connection with FIG. 4. Process 500 may be performed to provide a digital delay circuit for delaying a digital clock signal by a nominal delay and within a specified tolerance.

Design process 500 begins by obtaining initial design parameters (task 502) related to the desired performance of the digital delay circuit. For example, the following, and possibly other, parameters may be obtained during task 502: the clock period; the desired nominal delay; the allowable range of actual delay values; the nominal delay per buffer; the number of delay buffers in the matched delay elements;

and empirical delay characteristics of such delay elements. For the example embodiment, the bit period is 3.2 nanoseconds, the desired nominal delay is 800 picoseconds, the allowable range of delay is 700–900 picoseconds, the nominal delay per buffer is 40 picoseconds, the typical range of delay per buffer is 25–55 picoseconds, and the typical range of delay provided by a practical delay line designed to achieve the nominal delay (800 picoseconds) is 500–1100 picoseconds. The range of 500–1100 picoseconds is obtained through statistical empirical data collected under various operating conditions and/or for different device processes.

The empirical delay range is arbitrarily partitioned into a plurality of sectors (task 504), where each sector represents a different operating condition or characteristic relative to nominal operation of a delay element. The example embodiment contemplates four sectors and simply divides the empirical range into four equal sub-ranges: fast (500–650 picoseconds), moderately fast (650–800 picoseconds), moderately slow (800–950 picoseconds), and slow (950–1100 picoseconds), where the designations represent actual delay ranges. In this context, "fast" means that a delay line designed to provide a nominal delay will actually provide less than the nominal delay, and "slow" means that the delay line will actually provide more than the nominal delay. If more precision is desired, then the number of sectors can be increased such that the delay circuit can compensate for a higher number of operating conditions.

Next, the empirical range of propagation delay per buffer is calculated for each sector (task 506). This calculation is based upon the "ideal" tap number that would provide the nominal delay value. In the current example, the nominal desired delay is 800 picoseconds and the nominal delay per delay line buffer is 40 picoseconds. Thus, under ideal conditions, the output of delay tap twenty would provide a signal delayed by 800 picoseconds. The range of delay per buffer for each sector is calculated by dividing the empirical ranges determined in task 504 by the "ideal" tap number. The results of this calculation for the example embodiment are set forth in Table 1 below.

TABLE 1

Reference Delay Line Tap Selection

| SECTOR | DELAY TO TAP 20 | DELAY PER BUFFER | REFERENCE TAP |
|---|---|---|---|
| 1-Fast | 500–650 picoseconds | 25–32 picoseconds | 25 |
| 2-Moderately Fast | 650–800 picoseconds | 32–40 picoseconds | 20 |
| 3-Moderately Slow | 800–950 picoseconds | 40–47 picoseconds | 17 |
| 4-Slow | 950–1100 picoseconds | 47–55 picoseconds | — |

TABLE 1-continued

Using the delay per buffer values calculated during task 506, design process 500 determines the reference delay line taps that serve as the demarcation points of the various sectors (task 508). The determination of the demarcation taps is based upon the empirical delay per buffer ranges and the nominal design delay. For example, the demarcation between the "fast" sector and the "moderately fast" sector is represented by tap twenty-five of the reference delay line (800 picoseconds÷32 picoseconds≈25). Using this approach, the demarcation tap between the "moderately fast" sector and the "moderately slow" sector is tap twenty and the demarcation tap between the "moderately slow" sector and the "slow" sector is tap seventeen. The demarcation or reference taps for the example embodiment are identified in Table 1. Referring to FIG. 4, these demarcation taps are ultimately utilized to provide the variously delayed signals to flip flops 408/410/412. Notably, even though a practical reference delay element 404 may include more than 25 delay buffers and taps, digital delay circuit need only utilize three of the available tap outputs.

Figure 6:
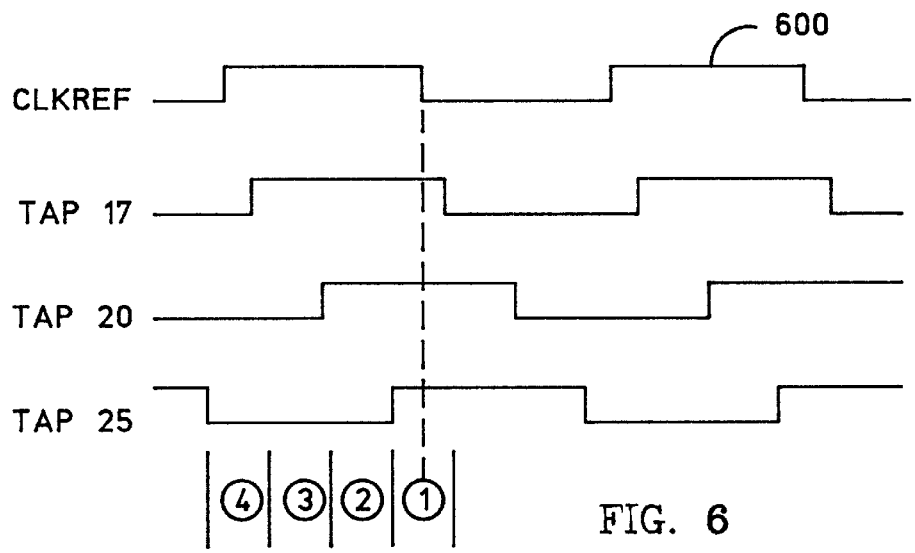
FIG. 6 is an example timing diagram of a reference clock signal and a number of tap output signals taken from a reference clock delay line element under fast operating conditions.
Figure 7:
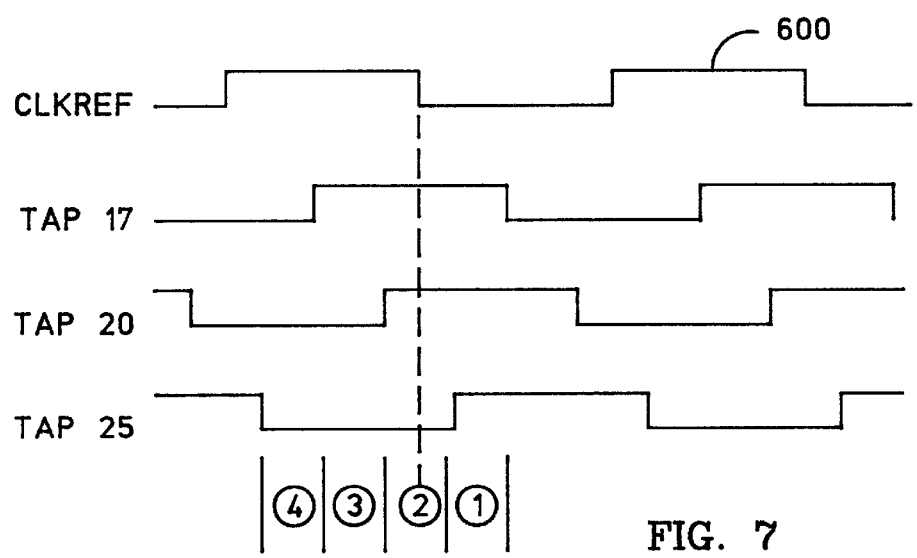
FIG. 7 is an example timing diagram of a reference clock signal and a number of tap output signals taken from a reference clock delay line element under moderately fast operating conditions.
Figure 8:
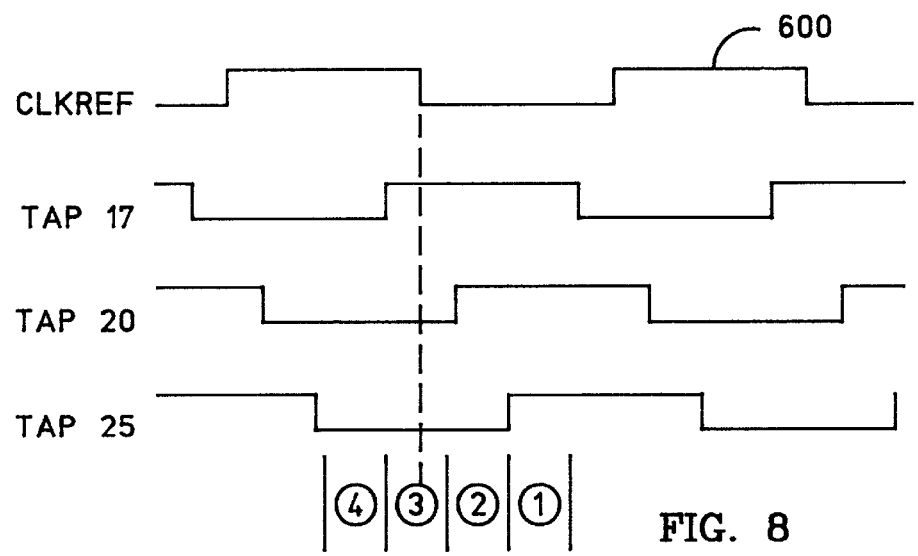
FIG. 8 is an example timing diagram of a reference clock signal and a number of tap output signals taken from a reference clock delay line element under moderately slow operating conditions.
Figure 9:
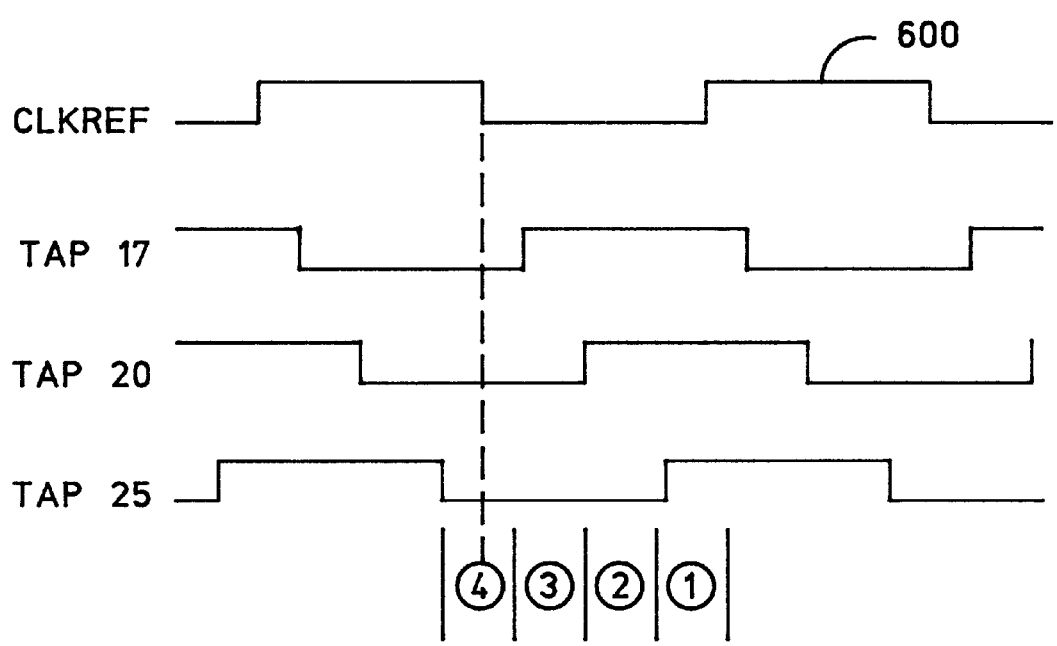
FIG. 9 is an example timing diagram of a reference clock signal and a number of tap output signals taken from a reference clock delay line element under slow operating conditions.

To better illustrate the concept of the sector demarcation points, FIG. 6 is an example timing diagram of a reference clock signal 600 and a number of tap output signals taken from a reference clock delay line element under fast operating conditions. FIGS. 7–9 are equivalent timing diagrams under moderately fast, moderately slow, and slow operating conditions, respectively. As mentioned previously, reference clock signal 600 is preferably generated by a precise and stable source such that reference clock signal 600 is substantially unaffected by variations in process and operating conditions. Accordingly, reference clock signal 600 is depicted as being consistent throughout FIGS. 6–9.

FIGS. 6–9 also depict delayed clock signals based upon reference clock signal 600; the delayed clock signals correspond to the outputs of taps seventeen, twenty, and twenty-five of the reference delay element. As described above, the selected delay taps are sampled with the falling transition edge of reference clock signal 600; the dashed vertical line in FIGS. 6–9 represents this sampling point. Under ideal and nominal conditions, the state of reference tap twenty will transition from low to high precisely at the falling edge of reference clock signal 600 (due to the stable 800 picosecond high time of reference clock signal 600 and the theoretical 800 picosecond delay associated with reference tap number twenty). If the current operating conditions are faster than nominal, however, then reference tap twenty will transition from low to high before the falling edge of reference clock signal 600 (as depicted in FIG. 6 and FIG. 7). Conversely, if the current operating conditions are slower than nominal, then reference tap twenty will transition from low to high after the falling edge of reference clock signal 600 (as depicted in FIG. 8 and FIG. 9).

In FIG. 6 (representing the "fast" sector), all three of the reference taps are high. Consequently, this state of the three reference taps (1, 1, 1) designates operation in the first or "fast" sector. In FIG. 7, (representing the "moderately fast" sector), reference tap twenty-five is low, while reference taps seventeen and twenty are high. Consequently, this state of the three reference taps (0, 1, 1) designates operation in the second or "moderately fast" sector. In FIG. 8, the (0, 0, 1) state designates operation in the third or "moderately slow" sector, and in FIG. 9, the (0, 0, 0) state designates operation in the fourth or "slow" sector. Notably, the number of demarcation points and the number of associated delay taps from the reference delay element can be increased if higher precision in the resulting delay is desired.

Referring back to FIG. 5, a task 510 may be performed to partially populate an decoder table with the reference tap state information. Table 2 depicts such an decoder table containing the example information. Using this approach, a subset of the reference delay line taps are selected such that variously delayed reference clock signals provided by the taps convey information identifying one of a plurality of operating conditions, namely, the speed of the reference delay line relative to a nominal speed.

TABLE 2

Partially Populated Decoder Table

| SECTOR | TAP 25 | TAP 20 | TAP 17 |
|---|---|---|---|
| Fast | 1 | 1 | 1 |
| Moderately Fast | 0 | 1 | 1 |
| Moderately Slow | 0 | 0 | 1 |
| Slow | 0 | 0 | 0 |

A subset of the taps from the input delay line are also suitably selected such that each of the taps provides a delayed input clock signal having an acceptable delay range corresponding to one of the plurality of operating conditions (task 512). For each sector, the determination performed during task 512 is based upon the empirical delay range per buffer for that sector (see task 506) and the tolerable range of actual delay (assumed to be 700–900 picoseconds in this example). For example, for the "fast" sector, tap twenty-eight yields a range of 700–896 picoseconds (25 picoseconds/buffer×28=700 picoseconds; 32 picoseconds/buffer×28=896 picoseconds), which falls within the desired range of 700–900 picoseconds. In this manner, the remaining three taps corresponding to the other three sectors are selected. Table 3 summarizes the results of this procedure. Referring to FIG. 4, these four selected taps are utilized by delay circuit 400 to provide four variously delayed clock signals, each of which is based upon input clock signal 418, to multiplexer 406.

TABLE 3

Input Delay Line Tap Selection

| SECTOR | DELAY PER BUFFER | TAP | DELAY TO TAP |
|---|---|---|---|
| Fast | 25–32 picoseconds | 28 | 700–896 picoseconds |
| Moderately Fast | 32–40 picoseconds | 22 | 704–880 picoseconds |
| Moderately Slow | 40–47 picoseconds | 18 | 720–846 picoseconds |
| Slow | 47–55 picoseconds | 16 | 752–880 picoseconds |

After the taps from each delay line are determined, adjustments can be made for the clock tree (this will shorten the input delay line) and to compensate for setup and hold time differences of the data latches. For example, if the setup time is greater than the hold time, then the input delay line will be longer.

A task 514 may be performed to configure the selection circuit, e.g., a multiplexer, to accommodate the number of input signals and to provide a single output signal. In this example, the multiplexer receives four input signals and selects one of the four inputs to serve as the basis for the output signal. Accordingly, as shown in FIG. 4, the multiplexer receives two binary selection signals that serve to identify one of the four input signals. With this configuration in mind, the decoder table can be populated with the selection bit information, thus mapping each of the four operating states or sectors to one of the four combinations of the two selection bits. The completed decoder table is depicted in Table 4.

TABLE 4

Populated Decoder Table

| SECTOR | TAP 25 | TAP 20 | TAP 17 | SELECT BIT 1 | SELECT BIT 0 |
|---|---|---|---|---|---|
| Fast | 1 | 1 | 1 | 1 | 1 |
| Moderately Fast | 0 | 1 | 1 | 1 | 0 |
| Moderately Slow | 0 | 0 | 1 | 0 | 0 |
| Slow | 0 | 0 | 0 | 0 | 1 |

Of course, the particular mapping between the three decoder input bits and the two decoder output bits need not follow Table 4, and any number of alternate decoding schemes may be utilized by the decoder. After the appropriate input and reference taps are selected, the decoder is appropriately configured, and the multiplexer is appropriately configured, a delayed input clock signal corresponding to one of the input delay taps can be selected for use as the delayed clock signal output. In accordance with the techniques described herein, the delayed clock signal output will have an actual delay within the desired range (e.g., 700–900 picoseconds) regardless of process variations and changing environmental operating conditions.

Figure 10A:
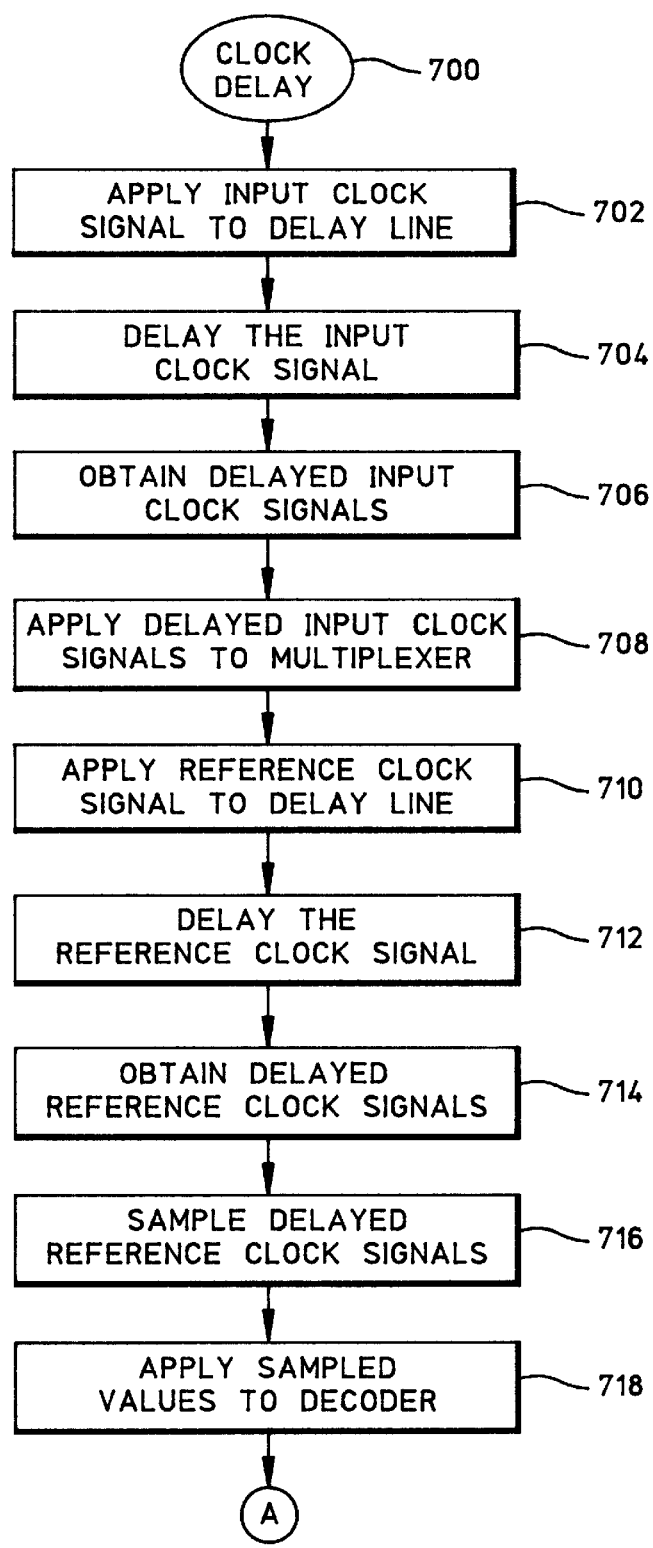
FIG. 10 is a flow diagram representing a clock delay process according to the present invention.
Figure 10B:
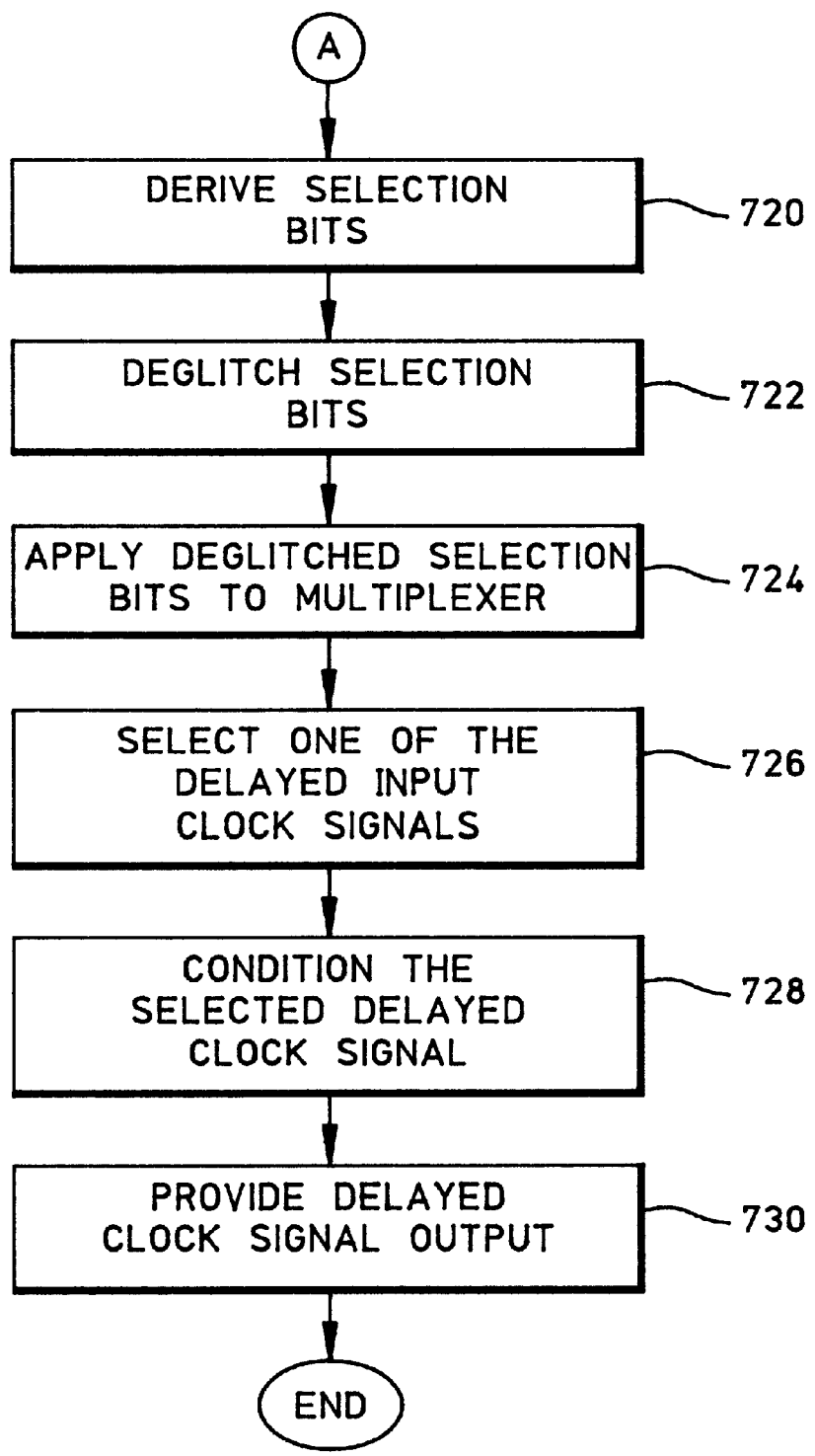

FIG. 10 is a flow diagram representing a clock delay process 700 according to the present invention. Clock delay process 700 may be performed by a digital delay circuit as described above. For consistency with the example embodiment, process 700 will be described with reference to delay circuit 400 and Tables 1–4.

Clock delay process 700 may begin by applying an input clock signal (obtained from an internal or external source) to the input delay line (task 702). The input delay line delays the input clock signal (task 704) in the manner described above in connection with delay element 300. Process 700 obtains a plurality of variously delayed input clock signals from the input delay line (task 706), where each of the delayed input clock signals is associated with a delay tap output of the input delay line. As described above, at least one of these delayed input clock signals exhibits an actual delay, relative to the input clock signal, that falls within an acceptable delay range corresponding to one of a plurality of operating conditions. In the example embodiment, the delayed input clock signals obtained during task 706 (or clock signals based upon the delayed input clock signals) are made available as inputs to a selection circuit such as multiplexer 406 (task 708).

Concurrently with the processing of the input clock signal, the delay circuit obtains a stable reference clock signal; the reference clock signal may be provided by an internal or external clock generator. In accordance with the preferred embodiment, the reference clock signal has a high (or low) time equal to the desired nominal delay time.

Accordingly, for the example embodiment, the reference clock signal has a high time of 800 picoseconds, a period of 1600 picoseconds, and a 50% duty cycle. Of course, an alternate reference clock signal having a different period and duty cycle can be employed (assuming the specified high/low time is maintained). Clock delay process 700 applies this reference clock signal to the reference delay line (task 710).

The reference delay line delays the reference clock signal (task 712) in the manner described above in connection with delay element 300. In this regard, clock delay process 700 obtains a plurality of variously delayed reference clock signals from the reference delay line (task 714), where each of the delayed reference clock signals is associated with a delay tap output of the reference delay line. As explained above, the variously delayed reference clock signals convey information identifying one of a plurality of operating conditions, e.g., the actual delay of the reference delay line relative to the nominal delay amount (the example embodiment refers to four relative "speeds" corresponding to the delay characteristics of the reference delay line). Consequently, the reference delay line is configured to provide empirical delay information that can be utilized to estimate the matching delay characteristics of the input delay line.

The delayed reference clock signals obtained during task 714 are sampled with an appropriately configured sampling circuit, such as a plurality of flip flops (task 716). The sampling of the delayed reference clock signals yields a plurality of sampled values (representing high or low states). In the example embodiment, each of the variously delayed reference clock signals is sampled at the same time and the sampling performed during task 716 is enabled by the reference clock signal. As depicted in FIG. 4, the example embodiment samples the delayed reference clock signals at the falling edge transition of the reference clock signal. Clock delay process 700 makes the sampled values available as inputs to decoder 414 (task 718), which derives selection bits from the sampled values (task 720). As mentioned above, these selection bits (or information based upon the selection bits) are eventually utilized as control inputs to multiplexer 406.

The delay circuit may deglitch the selection bits (task 722), utilizing deglitching circuit 416 and the input clock signal, to ensure that transitions in the selection bit states are stable relative to the timing of the input clock signal. The deglitched selection bits are applied to multiplexer 406 (task 724) to serve as the selection control signals. In response to the states of the selection bits, multiplexer 406 selects one of the delayed input clock signals (task 726) for use as a basis for a delayed clock signal output. In this regard, clock delay process 700 may perform an optional task 728, which suitably conditions or processes the delayed input clock signal (selected during task 726) for use as the delayed clock signal output. In other words, the delay circuit may further manipulate the selected delayed input clock signal before making it available for other purposes.

In the example embodiment shown in FIG. 4, the clock delay circuit utilizes the delayed input clock signal selected during task 726 as the delayed clock signal output (or otherwise makes the selected delayed input clock signal available for other purposes). Accordingly, task 730 provides a delayed clock signal output. Ultimately, the delayed clock signal output is based upon the original input clock signal, the original reference clock signal, the delayed reference clock signals, and the sampled values corresponding to the delayed reference clock signals. As mentioned above, the delayed clock signal output represents the original input clock signal delayed by approximately the specified nominal delay. In practice, the actual delay generated by the clock delay circuit will fall within the specified range of delay (700–900 picoseconds in the example embodiment). Notably, the clock delay circuit can select from among a plurality of variously delayed input clock signals to react, in substantially real-time, to changes in operating conditions that affect the performance of the delay line elements.

The present invention has been described above with reference to a preferred embodiment. However, those skilled in the art having read this disclosure will recognize that changes and modifications may be made to the preferred embodiment without departing from the scope of the present invention. For example, the techniques described herein can be extended for use with alternate embodiments that utilize more or less than four sectors, different nominal delay values, any number of buffers per delay line, etc. These and other changes or modifications are intended to be included within the scope of the present invention, as expressed in the following claims.

What is claimed is:

1. A method for delaying a digital clock signal comprising:

providing a reference clock signal;

delaying said reference clock signal;

obtaining a plurality of variously delayed reference clock signals in response to said delaying step;

sampling said plurality of variously delayed reference clock signals to obtain a plurality of sampled values; and generating a delayed clock signal based upon an input clock signal and based upon said plurality of sampled values.

2. A method according to claim 1, wherein:

said reference clock signal has a high/low time equal to a nominal delay; and said delayed clock signal represents said input clock signal delayed by approximately said nominal delay.

3. A method according to claim 1, wherein said sampling step is enabled by said reference clock signal.

4. A method according to claim 3, wherein said sampling step is enabled by a transition of said reference clock signal.

5. A method according to claim 1, wherein:

said delaying step is performed by a reference delay element having a plurality of delay buffers and a plurality of delay taps corresponding to said plurality of delay buffers; and said obtaining step obtains said plurality of variously delayed reference clock signals from a subset of said plurality of delay taps.

6. A method according to claim 1, wherein generating said delayed clock signal comprises:

delaying said input clock signal with an input delay element having a plurality of delay buffers and a plurality of delay taps corresponding to said plurality of delay buffers;

obtaining a plurality of variously delayed input clock signals from a subset of said plurality of delay taps; and selecting one of said variously delayed input clock signals in response to said plurality of sampled values.

7. A method according to claim 6, wherein generating said delayed clock signal further comprises conditioning said one of said variously delayed input clock signals for use as said delayed clock signal.

8. A method according to claim 6, further comprising outputting said one of said variously delayed input clock signals as said delayed clock signal.

9. A method according to claim 6, wherein selecting one of said variously delayed input clock signals is performed by a multiplexer.

10. A method according to claim 9, further comprising deriving selection bits for said multiplexer from said plurality of sampled values.

11. A method for delaying a digital clock signal comprising:

delaying an input clock signal with an input delay element having a plurality of input delay buffers and a number of input delay taps corresponding to a number of said input delay buffers, each of said number of input delay taps providing a respective delayed input clock signal having an acceptable delay range corresponding to one of a plurality of operating conditions;

providing a reference clock signal to a reference delay element having a plurality of reference delay buffers and a number of reference delay taps corresponding to a number of said reference delay buffers, said number of reference delay taps providing a number of variously delayed reference clock signals that convey information identifying one of said operating conditions;

selecting, in response to said variously delayed reference clock signals, a delayed input clock signal corresponding to one of said input delay taps as a basis for a delayed clock signal output; and sampling said reference delay taps at a transition of said reference clock signal to obtain a plurality of sampled values.

12. A method according to claim 11, wherein selecting said delayed input clock signal is responsive to said sampled values.

13. A method according to claim 12, wherein:

selecting said delayed input clock signal is performed by a multiplexer; and said method further comprises deriving selection bits for said multiplexer from said plurality of sampled values.

14. A digital delay circuit comprising:

a reference delay element having an input for receiving a reference clock signal, said reference delay element being configured to provide information identifying delay characteristics of said reference delay element;

an input delay element having an input for receiving an input clock signal, said input delay element and said reference delay element having matching operational characteristics, said input delay element being configured to provide a plurality of variously delayed input clock signals based upon said input clock signal; and a selection component, coupled to said input delay element and to said reference delay element, configured to select one of said variously delayed input clock signals in response to said information; wherein said reference delay element is configured to provide a number of output signals that convey said information.

15. A digital delay circuit according to claim 14, further comprising a processing circuit, coupled to said reference delay element, configured to:

receive said output signals;

generate selection signals in response to said output signals; and provide said selection signals to said selection component for use in selecting said one of said variously delayed input clock signals.

16. A digital delay circuit according to claim 15, wherein said selection component comprises a multiplexer.

17. A digital delay circuit according to claim 16, wherein said processing circuit comprises a digital decoder.

18. A digital delay circuit according to claim 14, wherein:

said reference delay element comprises a plurality of delay buffers and a plurality of delay taps corresponding to said plurality of delay buffers; and a subset of said plurality of delay taps provide said number of output signals.

19. A digital delay circuit according to claim 14, wherein:

said input delay element comprises a plurality of delay buffers and a plurality of delay taps corresponding to said plurality of delay buffers; and a subset of said plurality of delay taps provide said plurality of variously delayed input clock signals.

20. A digital delay circuit comprising:

an input delay element comprising an input for receiving an input clock signal, a plurality of input delay buffers, and a number of delay tap outputs corresponding to a subset of said plurality of input delay buffers, said delay tap outputs providing a number of variously delayed input clock signals based upon said input clock signal;

a reference delay element comprising an input for receiving a reference clock signal, a plurality of reference delay buffers, and a number of reference delay tap outputs corresponding to a subset of said plurality of reference delay buffers;

a sampling circuit coupled to said reference delay element, said sampling circuit being configured to sample output signals at said reference delay tap outputs to obtain a plurality of sampled values; and a selection circuit coupled to said sampling circuit and to said number of delay tap outputs, said selection circuit being configured to select one of said variously delayed input clock signals in response to said plurality of sampled values.

21. A digital delay circuit according to claim 20, wherein said selection circuit comprises a multiplexer, coupled to said number of delay tap outputs, configured to select one of said variously delayed input clock signals in response to a number of selection signals.

22. A digital delay circuit according to claim 21, further comprising a digital decoder, coupled to said sampling circuit, configured to:

receive said sampled values;

generate said selection signals in response to said sampled values; and provide said selection signals to said multiplexer.

23. A digital delay circuit according to claim 20, wherein said sampling circuit samples said output signals at a transition of said reference clock signal.

* * * * *